(12) United States Patent
Schaefer et al.

(10) Patent No.: US 8,329,532 B2
(45) Date of Patent: *Dec. 11, 2012

(54) PROCESS FOR THE SIMULTANEOUS DEPOSITION OF CRYSTALLINE AND AMORPHOUS LAYERS WITH DOPING

(75) Inventors: Herbert Schaefer, Hoehenkirchen-Siegertsbrunn (DE); Martin Franosch, Munich (DE); Thomas Meister, Taufkirchen (DE); Josef Boeck, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/314,595

(22) Filed: Dec. 8, 2011

(65) Prior Publication Data

US 2012/0074405 A1  Mar. 29, 2012

Related U.S. Application Data

(60) Continuation of application No. 13/026,326, filed on Feb. 14, 2011, now Pat. No. 8,102,052, which is a division of application No. 12/106,667, filed on Apr. 21, 2008, now Pat. No. 7,947,552.

(51) Int. Cl.
*H01L 21/8238* (2006.01)

(52) U.S. Cl. ........... 438/222; 257/E21.09; 257/E21.101; 257/E21.102; 257/E21.299; 257/E21.315

(58) Field of Classification Search .................. 438/222; 257/756, E21.09, E21.101, E21.102, E21.299, 257/E21.315; 428/222

See application file for complete search history.

(56) References Cited

U.S. PATENT DOCUMENTS 5,356,821 A * 10/1994 Naruse et al. ................. 438/234
6,197,666 B1   3/2001 Schafer et al.
6,440,810 B1 * 8/2002 Johansson et al. ............ 438/309
6,821,825 B2 * 11/2004 Todd et al. .................... 438/150
6,900,115 B2 * 5/2005 Todd ............................. 438/478
7,105,415 B2   9/2006 Bock et al.
7,186,630 B2 * 3/2007 Todd ............................. 438/478
7,273,799 B2 * 9/2007 Todd ............................. 438/478
7,396,733 B2 * 7/2008 Kanemoto .................... 438/400
7,598,178 B2 * 10/2009 Samoilov et al. ............. 438/706

(Continued)

FOREIGN PATENT DOCUMENTS

DE       19840238 C1    3/2000

(Continued)

OTHER PUBLICATIONS

Non-Final Office Action Dated Jul. 16, 2010 for U.S. Appl. No. 12/106,667. 30 Pages.

(Continued)

*Primary Examiner* — Thao Le
*Assistant Examiner* — Eric Jones
(74) *Attorney, Agent, or Firm* — Eschweiler & Associates, LLC

(57) ABSTRACT

One embodiment of the present invention relates to method for the concurrent deposition of multiple different crystalline structures on a semiconductor body utilizing in-situ differential epitaxy. In one embodiment of the present invention a preparation surface is formed, resulting in two distinct crystalline regions, a monocrystalline silicon substrate region and an isolating layer region. A monocrystalline silicon layer and an amorphous silicon layer are concurrently formed directly onto the preparation surface in the monocrystalline silicon substrate region and the isolating layer region, respectively. Deposition comprises the formation of two or more sub-layers. The process parameters can be varied for each individual sub-layer to optimize deposition characteristics.

20 Claims, 5 Drawing Sheets

U.S. PATENT DOCUMENTS

| | | | |
|---|---|---|---|
| 7,687,887 B1 * | 3/2010 | El-Diwany et al. | 257/565 |
| 7,947,552 B2 * | 5/2011 | Schafer et al. | 438/222 |
| 8,102,052 B2 * | 1/2012 | Schafer et al. | 257/756 |
| 2002/0168868 A1 * | 11/2002 | Todd | 438/767 |
| 2005/0048745 A1 * | 3/2005 | Todd | 438/489 |
| 2005/0233536 A1 * | 10/2005 | Bock et al. | 438/350 |
| 2006/0154450 A1 * | 7/2006 | Suzumura et al. | 438/478 |
| 2006/0240630 A1 * | 10/2006 | Bauer et al. | 438/301 |
| 2007/0032676 A1 * | 2/2007 | Todd | 556/482 |
| 2007/0296000 A1 * | 12/2007 | Hara | 257/211 |
| 2008/0014725 A1 * | 1/2008 | Todd | 438/482 |
| 2008/0044932 A1 * | 2/2008 | Samoilov et al. | 438/5 |
| 2010/0068863 A1 * | 3/2010 | Hijzen | 438/312 |

FOREIGN PATENT DOCUMENTS

| | | |
|---|---|---|
| DE | 19845787 A1 | 3/2000 |
| DE | 10317098 A1 | 7/2004 |

OTHER PUBLICATIONS

Notice of Allowance Dated Jan. 18, 2011 for U.S. Appl. No. 12/106,667. 23 Pages.

Non-Final Office Action Dated Apr. 20, 2011 for U.S. Appl. No. 13/026,326. 7 Pages.

Notice of Allowance Dated Sep. 27, 2011 for U.S. Appl. No. 13/026,326. 24 Pages.

* cited by examiner

PROCESS FOR THE SIMULTANEOUS DEPOSITION OF CRYSTALLINE AND AMORPHOUS LAYERS WITH DOPING

RELATED APPLICATION

This application is a Continuation of U.S. application Ser. No. 13/026,326 filed Feb. 14, 2011, which was a divisional of U.S. Pat. No. 7,947,552 issued May 24, 2011.

FIELD OF INVENTION

The present invention relates generally to semiconductor processing and more particularly to a process for the simultaneous deposition of two or more polycrystalline, monocrystalline, and amorphous layers with in-situ doping.

BACKGROUND OF THE INVENTION

When semiconductor devices are formed in integrated circuits, the devices are coupled to each other through the use of back end of the line metal interconnect levels. The resistance and capacitance of these metal interconnect levels has a negative effect on device performance, especially at high frequency operation. Therefore, to minimize the influence of parasitic components (e.g., resistance, capacitance), layers of low electrical resistance and capacitance are used as electrodes to connect the overlying metal interconnect levels selectively to the individual active semiconductor elements.

These electrode layers are often comprised of monocrystalline silicon, polycrystalline silicon, and/or amorphous silicon and are doped as required to give them needed electrical conductivity. To form doped crystalline layers a semiconducting substrate (e.g. silicon) can be subjected to a series of chemical and thermal processing steps which modify the electrical properties of certain areas of the substrate. Typically, formation of the silicon layers is performed by first depositing undoped silicon. The undoped silicon is subsequently doped by means of ion implantation. Finally, a temperature step sometimes referred to as an anneal is used to heal implantation damages and electrically activate the dopant.

Depositing a single crystalline layer can be performed by first forming a seed layer and then epitaxially growing a layer with the same crystalline structure on top of the seed layer. Epitaxial silicon is usually grown using vapor-phase epitaxy (VPE), a modification of chemical vapor deposition (CVD). Molecular-beam and liquid-phase epitaxy (MBE and LPE) can also be used. The use of MBE and LPE is mainly done for compound semiconductors. During depositions performed by any of these methods, narrow faults in the underlying layer are often completely filled.

Doping places either specific amounts of dopant atoms into the crystal lattice structure of the substrate or a film deposited on the substrate. in general, the electrical characteristics (e.g., conductivity, resistivity) of a defined region of a semiconductor structure are a function of the concentration and depth of the dopants in that region. in order to obtain electrical devices having predictable and reliable electrical characteristics, a doping process is controlled to provide a desired concentration and depth for dopant atoms within the substrate. In the formation of an epitaxially grown electrode layer, implantation doping can cause device issues as the doping will not be able to extend to the bottom of the faults formed during deposition and as a result, the grown layers will not be uniformly doped.

In-situ doping, which introduces dopant atoms during the epitaxial growth process, provides advantages over implantation doping in terms of layer integrity. One common method of in-situ doping is by gas phase deposition (e.g., chemical vapor deposition (CVD)). With a CVD doping process, a deposition gas and a dopant gas are supplied to a process chamber of a CVD reactor. A substrate to be doped and the process chamber are maintained at a relatively high temperature. In the process chamber, the deposition gas and the dopant gas thermally decompose and deposit onto the substrate. The deposited film is thus a mixture of a deposition species and a dopant species. The dopant atoms move by filling empty crystal positions (i.e. vacancies) or alternately move through the spaces between the crystal sites (i.e. interstitial).

As an example of a prior art CVD doping process, polysilicon thin films are deposited along with a dopant on a silicon substrate. A suitable deposition gas for depositing polysilicon is silane. In general, the silane decomposes under the vacuum and the high temperature of the process chamber and deposits onto the substrate.

For in-situ n-type doping, common dopants include phosphorous and arsenic. These dopants respectively utilize dopant gases comprising phosphine ($PH_3$) and arsine ($AsH_3$) in a CVD doping process. However, as a result of utilization of any of these dopant gases for in-situ doping, the epitaxial deposition rate decreases considerably. Further, it is difficult to achieve dopant concentrations above $1e20/cm^3$ using in-situ doping. For in-situ p-type doping, a common dopant is boron which utilizes a diborane ($B_2H_6$) gas in a CVD doping process.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

The present invention relates to method for the simultaneous deposition of multiple different crystalline structures on a semiconductor body utilizing in-situ differential epitaxy. In one embodiment of the present invention a preparation surface is formed, resulting in two distinct crystalline regions, a monocrystalline silicon substrate region and an isolating layer region. A monocrystalline silicon layer and an amorphous silicon layer are concurrently formed directly onto the preparation surface in the monocrystalline silicon substrate region and the isolating layer region, respectively. Deposition comprises the formation of two or more sub-layers. The process parameters can be varied for each individual sub-layer to optimize deposition characteristics. Other embodiments and methods are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
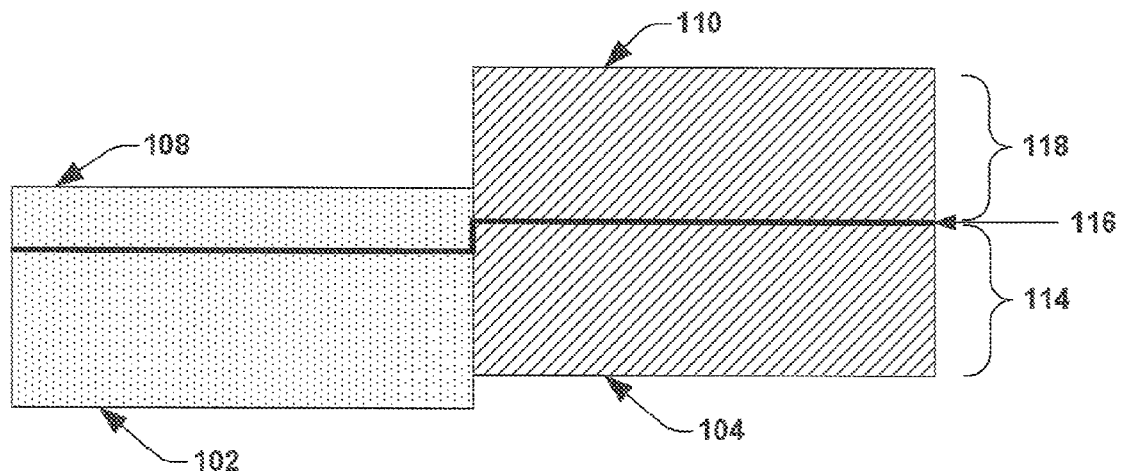
FIG. 1A shows a cross section of a simultaneous growth of in-situ doped monocrystalline and amorphous silicon layers.

The present invention will now be described with reference to the attached drawing figures, wherein like reference numerals are used to refer to like elements throughout, and wherein the illustrated structures and devices are not necessarily drawn to scale.

Due to the complexity of most modern day devices, it is often necessary to form more than one type of crystalline structure on a single semiconductor body. For example, many integration schemes used in the formation of vertical bipolar transistors require the simultaneous formation of multiple crystalline structures. Differential epitaxy is a method by which more than one crystalline structure is simultaneously formed on the same semiconductor body. Differential epitaxy offers an alternative method to multiple single layer depositions that can be used to achieve the same outcome. In one embodiment, the present invention discloses a method of differential epitaxy in which a monocrystalline silicon layer is grown on a monocrystalline silicon substrate at the same time as an amorphous silicon layer is grown on an adjacent isolating layer.

Figure 1B:
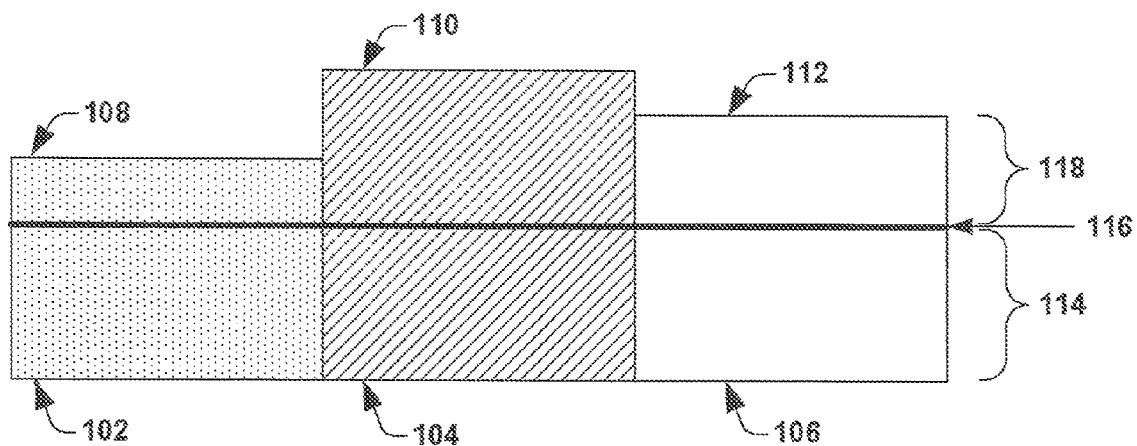
FIG. 1B shows a cross section of a simultaneous growth of in-situ doped monocrystalline, polycrystalline, and amorphous silicon layers

FIG. 1A illustrates a semiconductor body such as a substrate 114 comprising two distinct crystalline regions according to one embodiment. The first region comprises a monocrystalline silicon substrate region 104 having a monocrystalline lattice. The second region comprises an isolating layer region 102. Together, the monocrystalline silicon substrate region 104 and the isolating layer region 102 comprise a preparation surface 116. In one embodiment, the preparation surface 116 has steps between regions as shown in FIG. 1A. In another embodiment, the preparation surface 116 has a flat planar surface as shown in FIG. 1B. Consequently, it should be appreciated that the present invention may be initiated on a planar or non-planar semiconductor body surface, and both alternatives are contemplated as falling within the scope of the invention. In FIG. 1A, an amorphous silicon layer 108 has been epitaxially grown on the preparation surface 116 in the isolating layer region 102 concurrently with a monocrystalline silicon layer 110 that has been epitaxially grown onto the preparation surface 116 in the monocrystalline silicon substrate region 104. Together the monocrystalline silicon layer 110 and the amorphous silicon layer 108 comprise a deposited layer 118 formed over the preparation surface 116. The monocrystalline silicon layer 110 and the amorphous silicon layer 108 further each comprise two or more sub-layers formed using different process parameters.

FIG. 1B shows another embodiment of the present invention, a semiconductor body or substrate 114 comprising three distinct regions: an isolating layer region 102, a monocrystalline silicon substrate region 104, and a polycrystalline silicon substrate region 106. Differential epitaxy is used to concurrently form a deposited layer 118 comprising an amorphous silicon layer 108, a monocrystalline silicon layer 110, and a polycrystalline silicon layer 112 onto the preparation surface 116 in the isolating layer region 102, the monocrystalline silicon substrate region 104, and the polycrystalline silicon substrate region 106, respectively. In the example of FIG. 2B the monocrystalline silicon layer 110, the amorphous silicon layer 108, and the polycrystalline silicon layer 112 each comprise two or more sub-layers formed using different process parameters.

Figure 2:
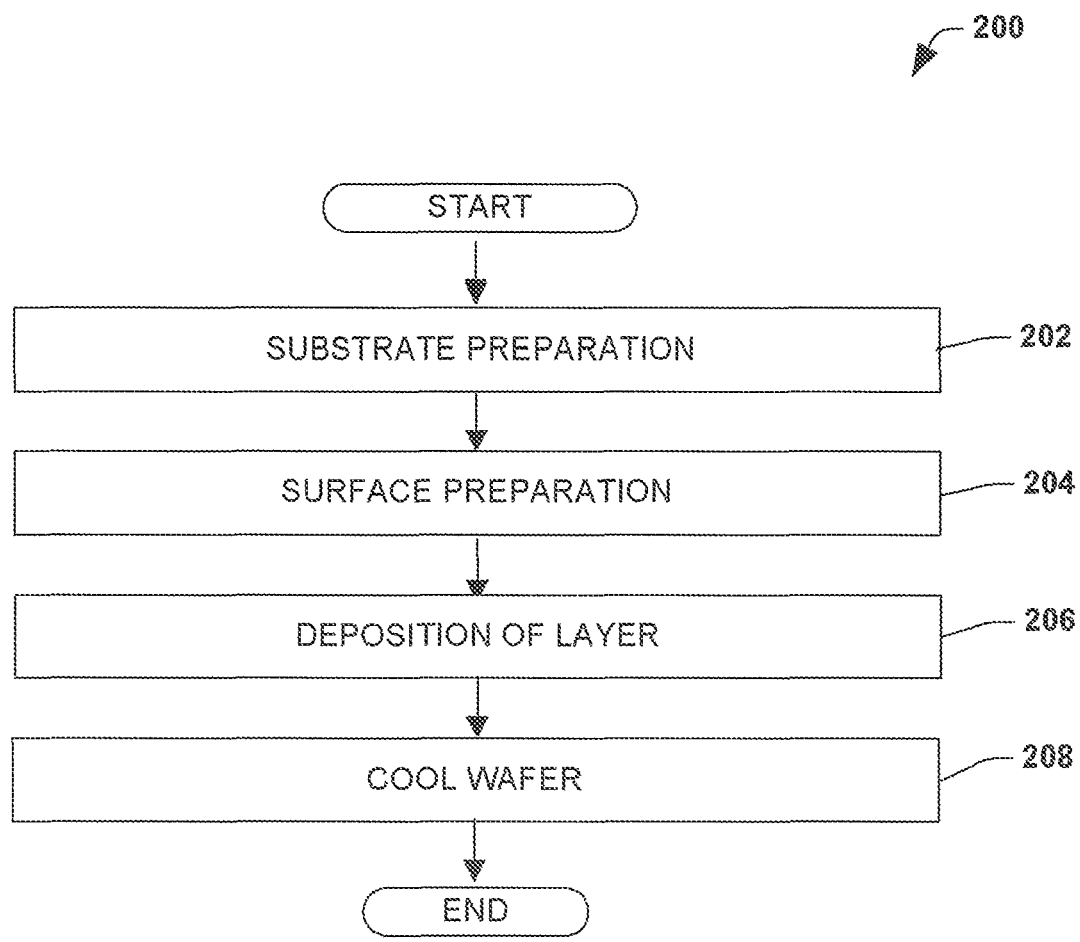
FIG. 2 shows a flow chart providing a method for the simultaneous growth of multiple in-situ doped crystal layers.

FIG. 2 shows a flow diagram of an exemplary methodology 200 for concurrently forming two or more crystalline layers according to the present invention. FIG. 3 thru FIG. 6 are cross sectional views of a semiconductor body or substrate 302 wherein such a method is implemented. While the method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

Figure 3:
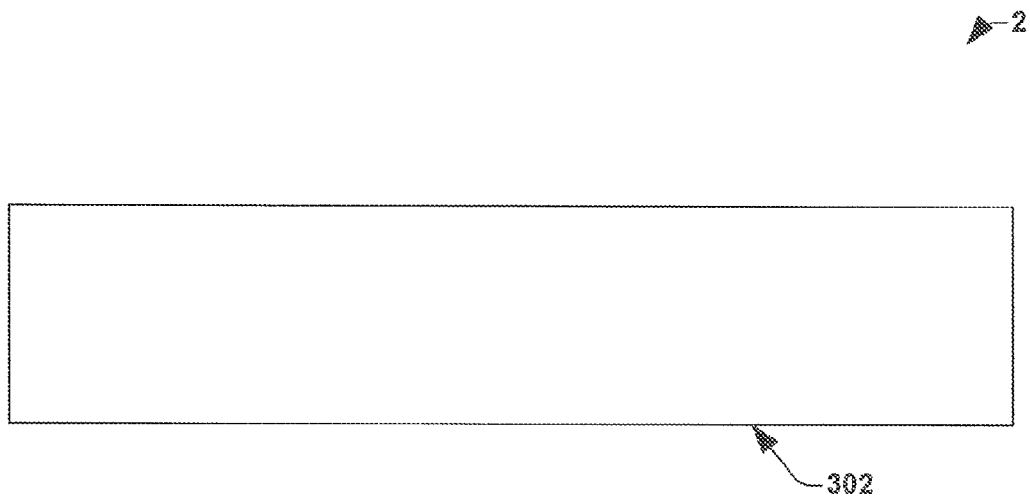
FIGS. 3-6 show cross sectional views of the method described in FIG. 2.

In the methodology of 200, it will also be appreciated that the substrate 302 of FIG. 3 as referred to herein may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith.

At 202 substrate preparation begins for subsequent epitaxial growth. Substrate preparation comprises forming at least two different crystalline surface areas within the same substrate.

Surface preparation of the substrate begins at 204 in one embodiment.

In varying embodiments surface preparation comprises in-situ annealing in hydrogen, removal of a native oxide that may have formed on the preparation surface, or placement of the semiconductor body into a deposition system.

At 206 an epitaxial layer is deposited directly onto the preparation surface of the semiconductor substrate. In one embodiment the deposition comprises forming a monocrystalline silicon layer and an amorphous silicon layer. In an additional embodiment the deposition further comprises forming a polycrystalline silicon layer. Each of the layer depositions comprises the formation of two or more sub-layers.

Once the deposition is completed, the semiconductor substrate 302 is cooled at 208.

Figure 4:
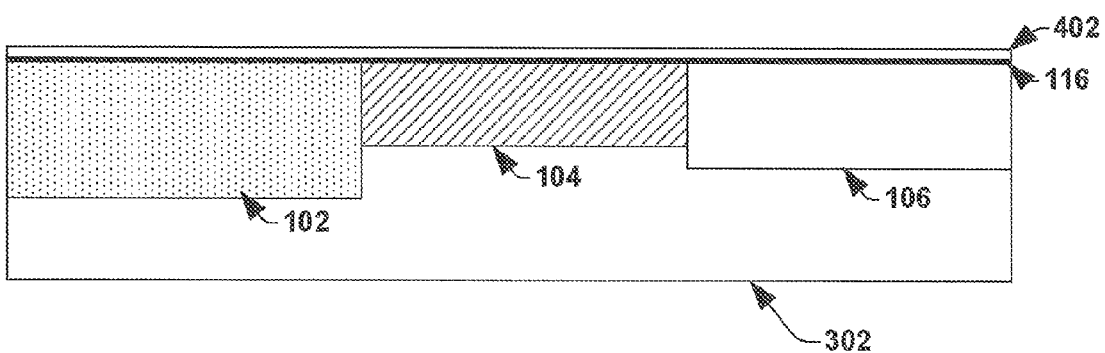

A more detailed example of a substrate preparation is now set forth in FIG. 4. As shown in FIG. 4, the substrate may comprise a monocrystalline silicon substrate region 104, an isolating layer region 102, and a polycrystalline silicon substrate region 106. In an alternative embodiment the substrate may comprise a monocrystalline silicon substrate region and an isolating layer region (e.g., oxide ($SiO_2$) or oxynitride ($SiO_xN_y$)).

Figure 5:
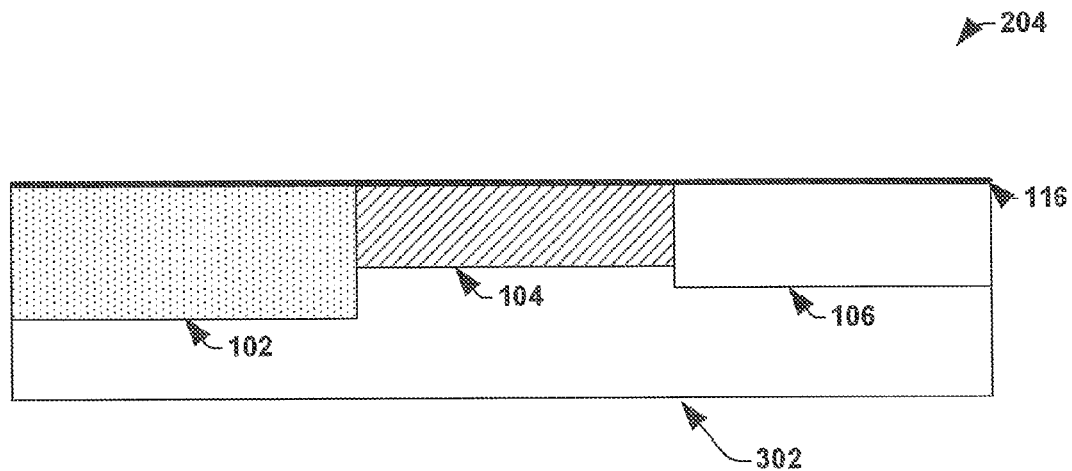

A more detailed example of a surface preparation is now set forth in FIG. 5. Surface preparation of the substrate comprises removing the native oxide 402 that may have formed on the preparation surface 116 of the substrate since 202, as illustrated in FIG. 4. For example, an oxide layer 402 will form when a bare silicon substrate is exposed to a gas containing oxygen (e.g., earth's atmosphere). The oxide 402 is removed using a wet-chemical etchant comprising a dilute hydrofluoric acid, for example, as illustrated in FIG. 5. Once the oxide 402 is removed, the wafer is rinsed with deionized water and dried, in one embodiment.

The semiconductor substrate 302 is then placed in a deposition system within a couple of minutes. For example, in one embodiment if wet chemical treatment is performed, typically the time to loading the wafer into the deposition chamber is restricted to less than 15 minutes to prevent renewed growth of native oxide. The deposition system may be an epitaxial growth system and may comprise a tube furnace, for example. The deposition system is evacuated and then filled with an inert gas to prevent the native oxide from growing back. In the case of single-wafer reactors, systems often have an evacuatable load lock chamber, in which the wafers can wait under an inert atmosphere until they are coated. In any case, in one embodiment the deposition system guarantees that the $O_2$ and $H_2O$ partial pressures are sufficiently low so that defect free monocrystalline growth is possible.

Surface preparation further comprises in-situ annealing in hydrogen (in-situ $H_2$ annealing). In-situ $H_2$ annealing is employed in one embodiment to obtain a monocrystalline, oxygen free silicon surface suitable for epitaxial monocrystalline growth. The in-situ $H_2$ annealing can be performed in the deposition chamber or in the case of cluster systems, in a special conditioning chamber within the same system. The in-situ $H_2$ annealing is performed, in one embodiment, with a $H_2$ gas flow rate of 10-50 standard liter per minute (slm), for example. The annealing also requires that the deposition chamber or conditioning chamber be placed at a temperature ranging from 700-900° C., for cases in which a wet-chemical etch was used, or 1000-1200° C., in cases where a wet-chemical etch was not used. For either case, the deposition chamber is held at a pressure of 1 to 760 torr in one embodiment. The annealing may be performed for 30-300 seconds.

Figure 6:
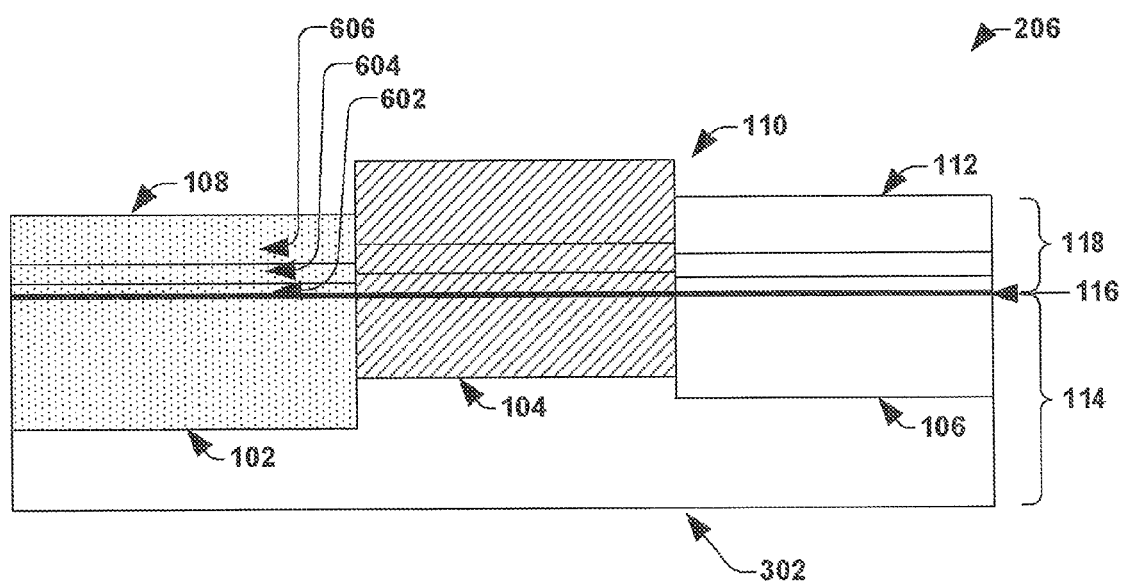

FIG. 6 sets forth a more detailed example of a layer deposition. In the embodiment shown in FIG. 6, the substrate comprises three different crystalline regions: a monocrystalline silicon substrate region 104, an isolating layer region 102, and a polycrystalline silicon substrate region 106. A monocrystalline silicon layer 110, an amorphous silicon layer 108, and a polycrystalline silicon layer 112 are concurrently deposited onto the monocrystalline silicon substrate region 104, the isolating layer region 102, and the polycrystalline silicon substrate region 106, respectively.

Each of the monocrystalline silicon layer 110, the amorphous silicon layer 108, and the polycrystalline silicon layer 112 are concurrently formed by depositing one or more individual sub-layers, each using an individual set of process parameters. For example, in FIG. 6 a first sub-layer 602 is formed under a first set of processing parameters (e.g., pressure, temperature, etc.), a second subsequent sub-layer 604 is formed under a second set of processing parameters, and a third subsequent sub-layer 606 is formed under a third set of processing parameters. In one embodiment, the transition from one sub-process to the next is carried out without a pause, and it can be either abrupt or gradual. The use of separate processing steps (i.e., sub-processes) allows the separate layers to be optimized for homogeneity of the layers, growth rate, and/or freedom from defects. Each process step will utilize a carrier gas, a silicon-containing gas, and one or more doping gases to provide the dopants for the in-situ doping.

In one embodiment, the first sub-layer 602 is deposited at a first pressure to an amorphous thickness between about 1 and 20 nm. The second sub-layer 604 is then deposited to an amorphous thickness of 2-50 nm by continuously changing the pressure (in one embodiment) to arrive at a desired pressure for the deposition of the remaining sub-layer. The third sub-layer 606 is subsequently deposited using the desired pressure selected to guarantee the concurrent growth of different crystalline structures at a high deposition rate. The third sub-layer 606 may be deposited to a thickness between about 20-500 nm. In other embodiments a reduced number, or an additional number, of sub-layers may be used for varying purposes and thicknesses.

More particularly, the process parameters for one embodiment of the present invention, a three sub-layer deposition, may be as stated below. The deposition of the first sub-layer may be performed in a deposition chamber that is held at a temperature between about 400 and 700 degrees Centigrade. The carrier gas is provided into the chamber at a flow rate between about 3 and 30 standard liter per minute (slm). In one embodiment the carrier gas comprises $H_2$. In additional embodiments Ar, He, or N may also comprise the carrier gas. The silicon-containing gas is provided to the chamber at a flow rate between about 50-500 standard cubic centimeter per minute (sccm). The silicon containing gas may comprise disilane ($Si_2H_6$), for example. For deposition of in-situ doped silicon layers, one or more doping gases may be used. A first doping gas may comprise arsine ($AsH_3$), phosphine ($PH_3$), and/or diborane ($B_2H_6$). Optionally, a second doping gas may be used to in-situ dope the amorphous silicon layer 108, the monocrystalline silicon layer 110 and the polycrystalline silicon layer 112 with electrically neutral carbon. Carbon doping is done concurrently with n-type/p-type doping. The second doping gas may comprise, for example, methylsilane ($SiH_3CH_3$), which does not influence the electrical properties of the layers. The incorporation of carbon into the monocrystalline silicon layer is performed substitutionally (i.e., into the lattice sites) at a rate of approximately 75% in one embodiment. Carbon doping reduces diffusion of the dopant (e.g., boron, phosphorous) in the monocrystalline silicon layer. In one embodiment of the present invention a first doping gas, arsine ($AsH_3$) is provided to the deposition chamber at a rate of between about 0.005 and 5 sccm and a second doping gas of methysilane is provided to the chamber at a rate of between about 0.1 and 10 sccm.

In one embodiment the second sub-layer is formed keeping the parameters the same as for the first sub layer and by gradually increasing the pressure within the deposition chamber to the value used in the third sub-layer.

The third sub-layer is formed using the same process parameters as the second sub-layer and keeping the pressure within the deposition chamber constant in a range between about 50 tour and 300 torr.

Figure 7:
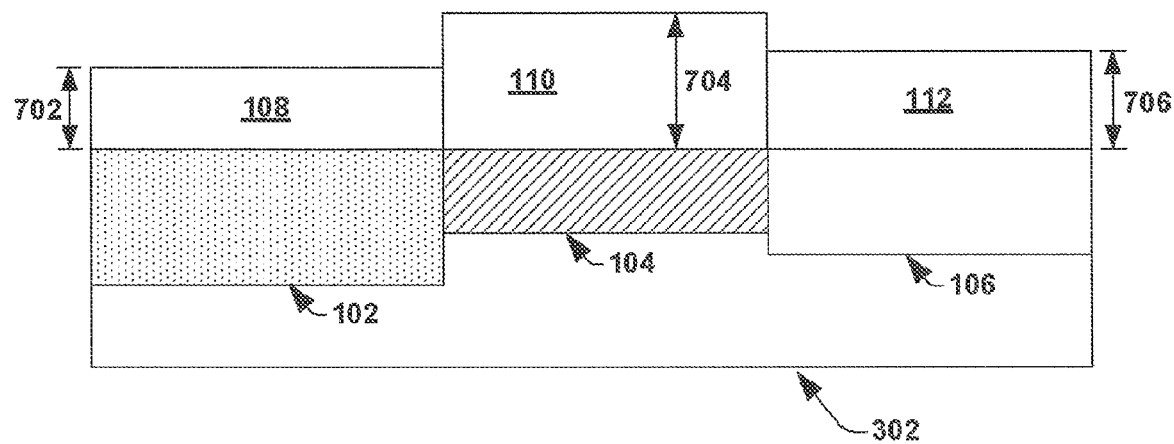
FIG. 7 shows a cross section view of a semiconductor body covered with a monocrystalline, polycrystalline, and amorphous epitaxial layer, wherein the thicknesses of the layers are noted.

When multiple crystalline structures are formed (e.g., monocrystalline, polycrystalline and amorphous silicon layers), the different crystalline structures will form at varying deposition rates to form varying thicknesses as shown in FIG. 7. In general, the ratio of the thickness of a deposited monocrystalline silicon layer 704 to the thickness of a deposited amorphous silicon layer 702 is in the range of 2:1 to 2:2. The ratio of the thickness of a deposited monocrystalline silicon layer 704 to the thickness of a deposited polysilicon silicon layer 706 is also in the range of 2:1 to 2:2, however the thickness of the deposited polysilicon layer 706 is greater than the thickness of a similarly formed amorphous silicon layer 702 (i.e., the deposition rate of polysilicon is greater than that of amorphous silicon).

The difference in crystalline growth rates provides a means for determining silicon growth in accordance with the present invention based upon the ratio of thickness of the monocrystalline silicon layer 704, the polycrystalline silicon layer 706, and amorphous silicon layer 702. For example, in one embodiment of the method of the present invention may provide an amorphous silicon layer 108 on an oxide or an oxynitride substrate 102 with a thickness 702 of about 130 nm and a monocrystalline silicon layer 110 on a monocrystalline silicon substrate 104 with a thickness 704 of about 200 nm, and a polycrystalline silicon layer 112 on a polycrystalline silicon substrate 106 with a thickness 706 of about 170 nm Additionally, structural differences resulting from silicon growth using a method of the present invention may occur due to additional temperature steps that are usually applied to convert amorphous layers into polycrystalline layers. If there are no longer any amorphous layers to be found in the finished component, therefore it cannot necessarily be concluded that they were not present during the production process. However, the surface roughness of amorphous layers is much lower than that of polycrystalline ones, and this situation does not usually change. Therefore, even on the finished component, it is possible to determine what structures the layers had when they were originally deposited.

The present invention overcomes a number of challenges that currently faced by in-situ differential epitaxy. The process parameters necessary to optimize crystalline growth differ for different crystal lattices. Defect free monocrystalline growth on a monocrystalline substrate requires that the atoms to be deposited occupy lattice sites on a monocrystalline substrate before they are covered by other atoms. To achieve this, monocrystalline growth is usually performed at high temperatures and low deposition rates. In contrast, amorphous silicon growth is best performed at high deposition rates and low temperatures. This is because amorphous crystalline growth is most easily obtained when atoms are immediately frozen in place during deposition and therefore prevented from occupying lattice sites. The present invention forms multiple crystalline layers using a common set of process parameters.

Among other challenges, to date, when used in conjunction with in-situ doping, differential epitaxy of multiple concurrent silicon layers has either not been possible, possible only at a low deposition rate, or possible only with additional or special dielectric layers to improve uniform starting of growth on the isolating layer. In-situ doped differential epitaxy has also proved to provide relatively low (e.g., $1e20/cm^3$) doping concentrations in the grown layer. The present invention provides a method by which differential epitaxy can be performed at a high deposition rate (e.g., up to 100 nm/min and more) to provide an epitaxially grown layer with high dopant concentrations (e.g., up to more than $1e21/cm^3$). Further, since the deposition is done using in-situ doping, once deposited, the dopants in the monocrystalline silicon layer are already highly electrically active. Therefore, this method eliminates the need for a subsequent temperature step to activate the dopants, although a subsequent thermal process is not prohibited.

Also of particular note for the present invention, is that no additional layer (e.g., seed layer) is required on the substrate to improve a uniform starting of growth of the amorphous silicon layer onto the isolating layer region. For example, the amorphous silicon layer may be deposited directly onto an oxide or oxynitride layer. This is illustrated in FIG. 1A and FIG. 1B, wherein the surface material below the preparation surface 116 is the same as what is formed thereover, the underlying regions 102, 104 and 106 do not operate as seed layers according to at least one embodiment of the invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for the concurrent deposition of multiple crystalline structures on a semiconductor body by means of in-situ differential epitaxy, comprising:
    forming a preparation surface associated with a semiconductor body, the preparation surface having a first region comprising monocrystalline silicon substrate and a second region comprising an isolating layer; and
    forming two or more sub-layers, each using different process parameters, to concurrently provide a monocrystalline silicon layer having two or more sub-layers directly on the preparation surface in the first region and an amorphous silicon layer having two or more sub-layers directly on the preparation surface in the second region.

2. The method of claim 1, wherein formation of the two or more sub-layers comprises:
    depositing a first sub-layer directly on the preparation surface in the first and second region;
    depositing a second sub-layer over the first sub-layer; and
    depositing a third sub-layer over the second sub-layer.

3. The method of claim 2, wherein the first sub-layer is deposited at a first pressure, the second sub-layer is deposited at a second pressure, and the third sub-layer is deposited at a third pressure.

4. The method of claim 3, wherein the first pressure and the third pressure are constant.

5. The method of claim 4, wherein the first pressure is less than the third pressure, and wherein the second pressure varies between the first pressure and the third pressure.

6. The method of claim 5, further comprising placing the semiconductor body in a deposition chamber located within a deposition system, wherein the deposition system guarantees that $O_2$ and $H_2O$ partial pressures within the deposition chamber are so low that defect free monocrystalline growth is possible.

7. The method of claim 6, further comprising providing a carrier gas within the deposition chamber, wherein the carrier gas comprises one of hydrogen ($H_2$), argon (Ar), helium (He) or nitrogen (N).

8. The method of claim 7, further comprising providing a doping gas within the deposition chamber, wherein the doping gas comprises one of arsine ($AsH_3$), phosphine ($PH_3$), or diborane ($B_2H_6$).

9. The method of claim 8, further comprising providing a methylsilane gas within the deposition chamber, wherein the methylsilane gas achieves a carbon doping of the monocystalline silicon layer and the amorphous silicon layer.

10. The method of claim 1, wherein forming the preparation surface further comprises a third region comprising a polycrystalline silicon substrate, and wherein a polycrystalline silicon layer is formed directly on the preparation surface in the third region concurrently with forming the monocrystalline silicon layer and the amorphous silicon layer.

11. The method of claim 1, wherein the isolating layer comprises an oxide or an oxynitride layer.

12. The method of claim 1, further comprising performing in-situ annealing in hydrogen ($H_2$) on the semiconductor body prior to concurrently forming the monocrystalline and amorphous silicon layers, wherein performing in-situ annealing in $H_2$ removes oxygen from the first region of the preparation surface to form a monocrystalline oxygen-free silicon surface.

13. The method of claim 12, further comprising performing a wet chemical etch prior performing in-situ annealing in $H_2$ to remove a native oxide layer from the surface of the semiconductor body.

14. A method for the concurrent deposition of two crystalline structures on a semiconductor body, comprising:
preparing the semiconductor body to have a monocrystalline silicon substrate region and an isolating layer region;
performing in-situ annealing in hydrogen ($H_2$) on the semiconductor body to remove oxygen from the monocrystalline silicon substrate;
concurrently depositing a first sub-layer over the monocrystalline silicon substrate region and the isolating layer region at a constant first pressure following performance of in-situ annealing in $H_2$;
concurrently depositing a second sub-layer over the monocrystalline silicon substrate region and the isolating layer region at a variable second pressure greater than the first pressure following deposition of the first sub-layer; and
concurrently depositing a third sub-layer over the monocrystalline silicon substrate region and the isolating layer region at a constant third pressure greater than the second pressure following the deposition of the second sub-layer;
wherein the first, second, and third sub-layers collectively form an amorphous silicon layer over the isolating layer region and a monocrystalline silicon layer over the monocrystalline silicon substrate region.

15. The method of claim 14, further comprising providing a methylsilane gas within the deposition chamber, wherein the methylsilane gas achieves a carbon doping of the first, second, and third sub-layers.

16. The method of claim 14, wherein the isolating layer region comprises an oxide or an oxynitride layer.

17. The method of claim 14, further comprising an additional temperature step to convert the amorphous silicon layer into a converted polycrystalline layer.

18. The method of claim 14, wherein the ratio of the thickness of the monocrystalline silicon layer to the thickness of the amorphous silicon layer is between 2:1 and 2:2.

19. A method of forming a multi-crystalline structure on a semiconductor body, comprising:
preparing the semiconductor body to have an oxide or an oxynitride region and a monocrystalline silicon substrate region; and
concurrently forming an amorphous silicon layer directly on the oxide or the oxynitride region, and a monocrystalline silicon layer directly on the monocrystalline silicon substrate region by a process of forming multiple sub-layers at different pressures, wherein the ratio of a thickness of the monocrystalline silicon layer to a thickness of the amorphous silicon layer is between approximately 2:1 and 2:2.

20. The method of claim 19, further comprising:
preparing the semiconductor body to have a polysilicon substrate region; and
concurrently forming a polycrystalline silicon layer directly on a polysilicon substrate, wherein the ratio of a thickness of the monocrystalline silicon layer to a thickness of the polycrystalline silicon layer is between approximately 2:1 and 2:2, and wherein the ratio of the thickness of the polycrystalline silicon layer to the thickness of the amorphous silicon layer is greater than approximately 1:1.0

* * * * *